United States Patent [19]
Levy et al.

[11] Patent Number: 6,120,597
[45] Date of Patent: Sep. 19, 2000

[54] CRYSTAL ION-SLICING OF SINGLE-CRYSTAL FILMS

[75] Inventors: Miguel Levy, New York; Richard M. Osgood, Jr., Chappaqua, both of N.Y.

[73] Assignee: The Trustees of Columbia University in the City of New York, New York, N.Y.

[21] Appl. No.: 09/025,114

[22] Filed: Feb. 17, 1998

[51] Int. Cl.[7] .................................................. C30B 31/22
[52] U.S. Cl. ................... 117/3; 117/915; 117/4; 438/406; 438/407; 438/458; 216/62; 216/87
[58] Field of Search .................... 438/406, 407, 438/458; 216/62, 87; 117/3, 4, 915

[56] References Cited

U.S. PATENT DOCUMENTS

| | | | |
|---|---|---|---|
| 4,303,463 | 12/1981 | Cook | 117/915 |
| 4,308,078 | 12/1981 | Cook | 117/915 |
| 4,601,779 | 7/1986 | Abernathey et al. | 156/628 |
| 5,374,564 | 12/1994 | Bruel | 437/24 |
| 5,877,070 | 3/1999 | Goesele et al. | 117/915 |

OTHER PUBLICATIONS

"Fabrication of Single–Crystal Lithium Niobate Films by Crystal Ion Slicing", M. Levy, R.J. Osgood, Jr., R. Liu, L.E. Cross, G.S. Cargill III, A. Kumar and H. Bakhru, ©1998 American Institute of Physics, Applied Physics Letters, vol. 73, No. 16, Oct. 19, 1998.

"Mechanism of Silicon Exfoliation Induced by Hydrogen/Helium Co–Implantation", M.K. Weldon, M. Collot, Y.J. Chabal, V.C. Venezia, A. Agarwal, T.E. Haynes, D.J. Eaglesham, S.B. Christman and E.E. Chaban; Dec. 1998.

"Hydrogen Induced Silicon Surface Layer Cleavage", X. Lu, N.W. Cheung, M.D. Strathman, P.K. Chu, B. Doyle, Appl. Phys. Lett. 71 (13) Sep. 29, 1997, ©1997 American Institute of Physics.

"Basic Mechanisms Involved in the Smart–Cut® Process", B. Aspar, M. Bruel, H. Moriceau, C. Maleville, T. Poumeyrol, A.M. Papon, A. Claverie. G. Benassayag, A.J. Auberton–Hervé, T. Barge, Microelectronic Engineering 36 (1997), 233–240.

Efficient Production of Silicon–on–Insulator Films by Co–Implantation of $He^+$ with $H^+$, A Agarway, T.E. Haynes, V.C. Venezia, O.W. Holland, D.J. Eaglesham, Applied Physics Letters, vol. 72, No. 9, Mar. 2, 1998.

"High–Dose Helium–Implanted Single–Crystal Silicon: Annealing Behavior", R. Tonini, F. Corni, S. Frabboni, G. Ottaviani, G.F. Cerofolini, Journal of Applied Physics, vol. 84, No. 9, Nov. 1, 1998.

"Layer Splitting Process in Hydrogen–Implanted Si, Ge, SiC, and Diamond Substrates", Q.Y. Tong, K. Gurjahr, S. Hopfe, U. Gösele, T.H. Lee, Applied Physics Letter 70(11) Mar. 17, 1997, ©1997 American Institute of Physics.

"Silicon on Insulator Material Technology", M. Bruel, Electronics Letters, Jul. 6, 1995, vol. 34, No. 14.

"The History, Physics, and Applications of the Smart–Cut® Process", M. Bruel, MRS Bulletin, Dec. 1998.

(List continued on next page.)

*Primary Examiner*—Robert Kunemund
*Attorney, Agent, or Firm*—Baker Botts LLP

[57] ABSTRACT

A method is provided for detaching a single-crystal film from an epilayer/substrate or bulk crystal structure. The method includes the steps of implanting ions into the crystal structure to form a damage layer within the crystal structure at an implantation depth below a top surface of the crystal structure, and chemically etching the damage layer to effect detachment the single-crystal film from the crystal structure. The method of the present invention is especially useful for detaching single-crystal metal oxide films from metal oxide crystal structures.

43 Claims, 6 Drawing Sheets

OTHER PUBLICATIONS

"Single–Crystal Diamond Plate Liftoff Achieved by ION Implantation and Subsequent Annealing", N.R. Parikh, J.D. Hunn, E. McGucken, M.L. Swanson, C.W. White, R.A. Rudder, D.P. Malta, J.B. Posthill and R.J. Markunas, Appl. Phys. Lett. 61 (26), Dec. 28, 1992.

"Improved Heat Treatment for Wafer Direct Bonding Between Semiconductors and Magnetic Garnets", H. Yokoi, T. Mizumoto, K. Maru and Y. Naito, Jpn. J. Appl. Phys. vol. 36 (1997) Pt. 1. No. 5A.

"Improved Heat Treatment for Wafer Direct Bonding between Semiconductors and Magnetic Garnets", Hideki Yokoi, Tetsuya Mizumoto, Koichi Maru and Yoshiyuki Naito, Department of Physical Electronics, Faculty of Engineering, Tokyo Institute of Technology, pp. 2784–2787;.

"Direct Bonding Between InP Substrate and Magnetoopic Waveguides", Hideki Yokoi, Tetsuya Mizumoto, Koichi Maru, Nobutaka Fuke and Yoshiyuki Naito, Department of Physical Electronics, Faculty of Engineering, Tokyo Institute of Technology, pp. 4138–4140;.

"Differential Etching of Ion–Implanted Garnet", W. A. Johnson, J.C. North and R. Wolfe, J. Appl. Phys., vol. 44, No. 10, Oct. 1973, pp. 4753–4757;.

"Epitaxial Lift–Off of ZnSe Based II–VI Structures", C. Brys. F. Vermaerke, P. Demeester, P. Van Daele, K. Rakennus, A. Salokatve, P. Uusimaa, M. Pessa, A.L. Bradley, J.P. Doran, J. O'Gorman and J. Hegarty, Appl. Phys. Lett. 66 (9), Feb. 27, 1995, pp. 1086–1087;.

"Epitaxial NmGa/NiGa Magnetic Multilayers on GaAs", M. Tanaka, J.P. Harbison, T. Sands, B. Philips, T.L. Cheeks, J. De Boeck, L.T. Florz and V.G. Keramidas, Appl. Phys. Lett. 63 (5), Aug. 2, 1993, pp. 696–698;.

"The Separation of Thin Single Crystal Films from Bulk Diamond by MeV Implantation", J.D. Hunn, S.P. Withrow, C.W. White, R.E. Clausing, L. Heatherly, C. Paul Christensen, N.R. Parikh, Nuclear Instruments and Methods in Physics Research B 99 (1995), pp. 602–605;.

"Epitaxial Lift–Off of Thin InAs Layers", Joel Fastenau, Ekmel Özbay, Gary Tuttle and Fran Laabs, Journal of Electronic Materials, vol. 24, No. 6, 1995;.

"A 'Smarter–Cut' Approach to Low Temperature Silicon Layer Transfer", Q.Y. Tong, R. Scholz, U. Gösele, T.H. Lee, L.J. Huang, Y.L. Chao and T.Y. Tan, Appl. Phys. Lett. 72 (1), Jan. 5, 1998;.

"Epitaxial Liftoff of Thin Oxide Layers: Yttrium Iron Garnets onto GaAs", M. Levy, R. M. Osgood, Jr., A. Kumar and H. Bakhru, Appl. Phys. Lett 71 (18), Nov. 3, 1997.

CRYSTAL ION-SLICING OF SINGLE-CRYSTAL FILMS

STATEMENT REGARDING FEDERALLY SPONSORED RESEARCH

The invention described herein was funded in part by a grant from the Defense Advanced Research Projects Agency (DARPA)/Multidisciplinary University Research Initiative (MURI), namely, grant #DARPA/MURI 52346. The United States Government may have certain rights under the invention.

TECHNICAL FIELD OF THE INVENTION

This invention is related in general to the field of manufacturing integrated circuit devices utilizing single-crystal films. More particularly, the invention is related to a method for detaching micron-thin single-crystal metal oxide films from metal oxide crystal structures for bonding onto growth-incompatible substrates.

BACKGROUND OF THE INVENTION

Epitaxial liftoff techniques have been used since 1987 for achieving heterogeneous integration of many III–V and elemental semiconductor integrated circuits. For example, epitaxial liftoff has been shown to be effective for integrating hetero-junction bipolar transistors ("HBT's") and diode lasers on silicon, gallium arsenide and other common substrates. Despite this success, however, it has been impossible to integrate devices comprised of other important materials, namely non-semiconductor materials such as metal oxides, on these common substrates.

A need for integrated circuit devices combining non-semiconductor materials with conventional substrates has arisen in the field of electro-optic and magneto-optic communications. For example, a need has arisen for on-chip integrated magneto-optical devices, such as optical isolators, for use in fiber-optic telecommunications networks. Although commercially available isolators use bulk bismuth-substituted yttrium iron garnet ("Bi—YIG"), and other conventional integrated isolators require epitaxial growth on gadolinium gallium garnet ("GGG"), conventional epitaxial growth technologies are subject to the limitations of high temperature chemistry, complex stoichiometry and lattice matching.

More importantly, conventional methods are ineffective for growing single crystal-structures that exhibit good optical and magnetic properties for combination with semiconductor materials. Efforts using sputter growth technology for the growth of polycrystalline films, for example, have been unsuccessful in yielding single-crystal films with acceptable optical and magnetic properties.

Another need for integrated circuit devices combining non-semiconductor materials with conventional substrates has arisen in the field of microwave communications. For example, the need has arisen for frequency agile resonators requiring integrated circuit devices. Conventional frequency agile resonators, made of poly-crystalline materials such as ferroelectric solids, are undesirable because of their limited bandwidth and high loss tangents. Instead, it is desirable to construct frequency agile resonators and other integrated microwave circuits which are made of ferroelectric or magneto-optic single-crystal films.

Furthermore, conventional epitaxial liftoff techniques as developed for III–V semiconductors make use of the large differential etch rates between a buried sacrificial layer and the epitaxial structure of interest to detach the latter from its growth substrate. For example, early epitaxial liftoff techniques were based on the high wet etch selectivity of an aluminum arsenide ("AlAs") layer over an aluminum gallium arsenide ("$Al_xGa_{1-x}As$") layer. Subsequent work has demonstrated the liftoff of epitaxially grown layers in other III–V materials, all based on selective etching of sacrificial epitaxial layers. Conventional bonding techniques for epitaxially grown layers have included the use of adhesives and van der Waals forces on bare substrates.

Therefore, it is an object of the present invention to provide a method for detaching micron-thin single-crystal films from crystal structures, such as epilayer/substrate or bulk metal oxide crystal structures, for bonding onto growth-incompatible substrates.

It is another object of the present invention to provide a method for detaching micron-thin single-crystal films made of magnetic garnet materials from growth-compatible substrates for use in integrated photonics and microwave circuits.

It is still another object of the present invention to provide a method for detaching micron-thin single-crystal films made of ferroelectric materials from growth-compatible substrates or bulk crystal structures for use in integrated photonics and microwave circuits.

It is yet another object of the present invention to provide a method for detaching micron-thin single-crystal films from growth-compatible substrates without using conventional etching techniques.

Further objects, features and advantages of the invention will become apparent from the following detailed description taken in conjunction with the accompanying figures showing illustrative embodiments of the invention.

SUMMARY OF THE INVENTION

In accordance with a preferred method of the present invention, a method is provided for detaching a single-crystal film from a crystal structure. The crystal structure, for example, can be an epilayer/substrate crystal structure or a bulk crystal structure. The method includes the steps of implanting ions into the crystal structure to form a damage layer within the crystal structure at an implantation depth below a top surface of the crystal structure, and then chemically etching the damage layer to effect detachment of the single-crystal film from the crystal structure. The preferred method of the present invention is especially useful for detaching single-crystal metal oxide films from metal oxide crystal structures.

In accordance with another preferred method of the present invention, a method is provided for detaching a single-crystal film from a crystal structure, the method including the steps of implanting ions into the crystal structure to form a damage layer within the crystal structure at an implantation depth below a top surface of the crystal structure, and then exposing the damage layer to a rapid temperature increase to effect detachment of the single-crystal film from the growth-compatible substrate.

In accordance with yet another preferred method of the present invention, a method is provided for detaching a single-crystal film from a crystal structure, the method including the steps of implanting ions into the crystal structure to form a damage layer within the crystal structure at an implantation depth below the crystal structure, bonding the crystal structure to a second substrate, and exposing the damage layer to a rapid temperature increase to effect detachment of the single-crystal film from the crystal structure.

BRIEF DESCRIPTION OF THE DRAWINGS

For a complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1A:
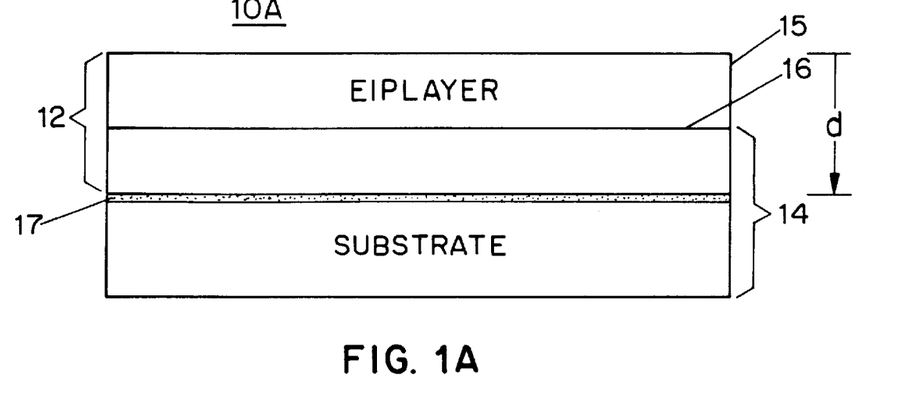
FIGS. 1A and 1B show an epilayer/substrate crystal structure and bulk crystal structure, respectively, for providing a single-crystal film according to the preferred crystal ion-slicing methods of the present invention.
Figure 1B:
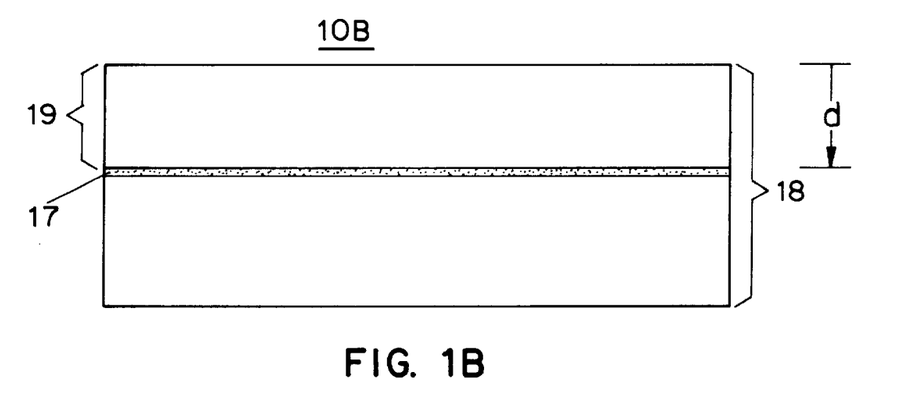

FIGS. 1A and 1B show crystal structures for providing single-crystal films 12 and 19 according to the preferred crystal ion-slicing methods of the present invention. Both FIGS. 1A and 1B show portions 15 and 18, respectively, for forming the single-crystal films 12 and 19, respectively. Advantageously, the crystal structures of FIGS. 1A and 1B can be metal oxide crystal structures having metal oxide portions 15 and 18 for forming single-crystal metal oxide films.

FIG. 1A shows an epilayer/substrate crystal structure 10A having a substrate 14, an epilayer 15 disposed on a top surface of the substrate 14, an epilayer/substrate interface 16, and a damage layer 17 disposed in the substrate 14 a depth d below the top surface of the epilayer/substrate crystal structure 10A. Although the damage layer 17 of FIG. 1A is shown to be below the epilayer/substrate interface 16, alternatively the damage layer 17 can be disposed within the epilayer 15 as required.

The epilayer 15 of FIG. 1A can be a metal oxide epilayer used for forming a single-crystal metal oxide film. As such, the epilayer 15 can be a layer of magnetic garnet material, preferably yttrium iron garnet ("YIG"), bismuth-substituted yttrium iron garnet ("Bi—YIG") or other garnet materials, disposed on the top surface of a gadolinium gallium garnet ("GGG") or other growth-compatible substrate. The metal oxide epilayer 15 can also be a layer of ferroelectric material, such as lithium niobate ("$LiNbO_3$") or strontium titanate ("$SrTiO_3$"), disposed on the top surface of a growth compatible substrate. Alternatively, the epilayer/substrate crystal structure 10A may include a plurality of the metal oxide epilayers disposed therein.

FIG. 1B shows a bulk crystal structure 10B for forming a single-crystal film 19. The bulk crystal structure 10B also includes a damage layer 17 disposed therein at a depth d below the top surface of the bulk crystal structure 10B. Advantageously, the bulk crystal structure 10B can be a metal oxide structure used for forming a single-crystal metal oxide film. As further shown in FIG. 5, the bulk crystal structure 10B of FIG. 1B is the preferred crystal structure for forming $LiNbO_3$ single-crystal films according to the preferred crystal ion-slicing methods of the present invention.

Figure 2:
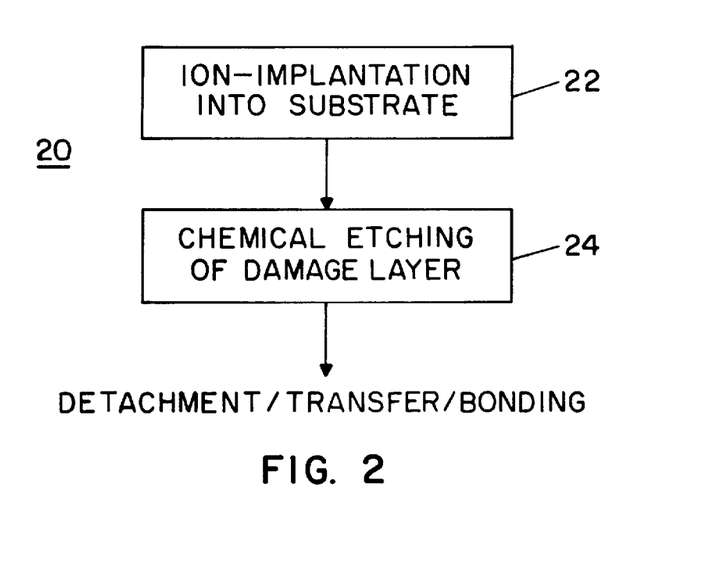
FIG. 2 shows a preferred method for crystal ion-slicing of single-crystal films.

FIG. 2 shows a preferred method 20 for crystal ion-slicing a single-crystal film from a crystal structure. The method includes the steps of implanting ions into a crystal structure to form a damage layer within the substrate (Step 22) and chemical etching the damage, or "sacrificial," layer from the substrate (Step 24). The single-crystal film is thereby detached from the substrate for transfer and bonding onto a growth-incompatible structure such as silicon or gallium arsenide.

Figure 3:
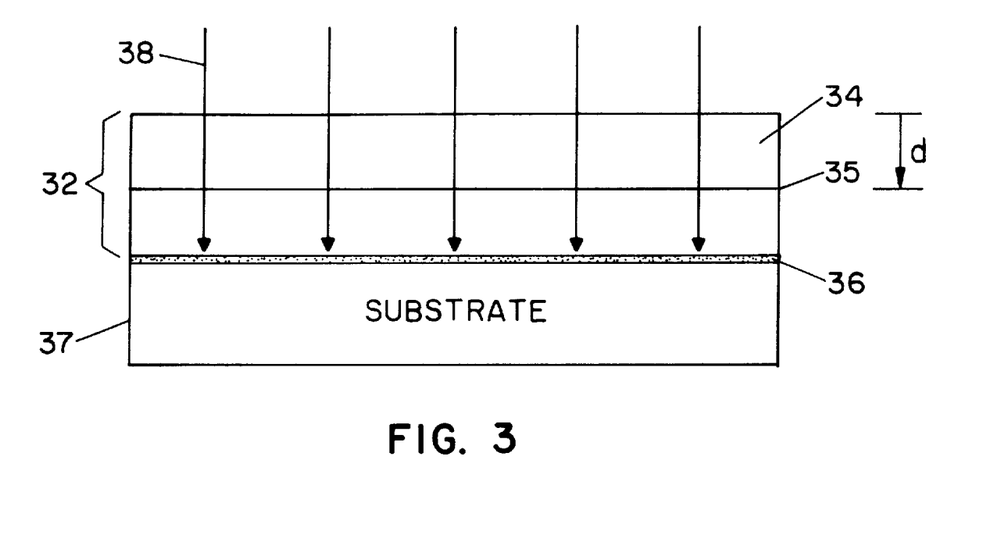
FIG. 3 shows an ion implantation step according to the crystal ion-slicing method of FIG. 2.

FIG. 3 shows an ion implantation step according to the crystal ion-slicing method of FIG. 2. Although shown with respect to an epilayer/substrate crystal structure, the ion implantation step of FIG. 3 is also applicable for detaching single-crystal films from bulk crystal structures.

As shown in FIG. 3, elemental ions 38 such as energetic helium or hydrogen ions, for example, are implanted at a predetermined energy into an epilayer/substrate crystal structure 30 having a substrate 37, an epilayer 34 disposed on the substrate 37, and an epilayer/substrate interface 35. The ions can also be chemically reactive ions that react with the crystal lattice after implantation. The ions are implanted through the epilayer 34 such that a damage layer 36 is formed at a depth d below the top surface of the epilayer/substrate crystal structure 30. Alternatively, the damage layer 36 can be formed within the epilayer 34.

The ion implantation step introduces lattice defects into the crystal structure 30 in forming the damage layer 36. The lattice defects are introduced by the transfer of energy to the target nuclei, and are formed near the end of the ionic trajectories. Depending upon the selected implantation species and ionic energy, the lattice defects and thus the damage layer 36 are introduced into the substrate 37 at a depth d below the surface of the crystal structure 30.

Referring again to FIG. 3, the thickness of the single-crystal film 32 is therefore determined by the energy level of the implanted ions 38, which can be varied accordingly to yield the desired film thickness. The damage layer, or "sacrificial," layer, enables the single-crystal film 32 to be "sliced-off" the top of the crystal structure 30 for transfer and bonding onto a growth-incompatible substrate.

Figure 4:
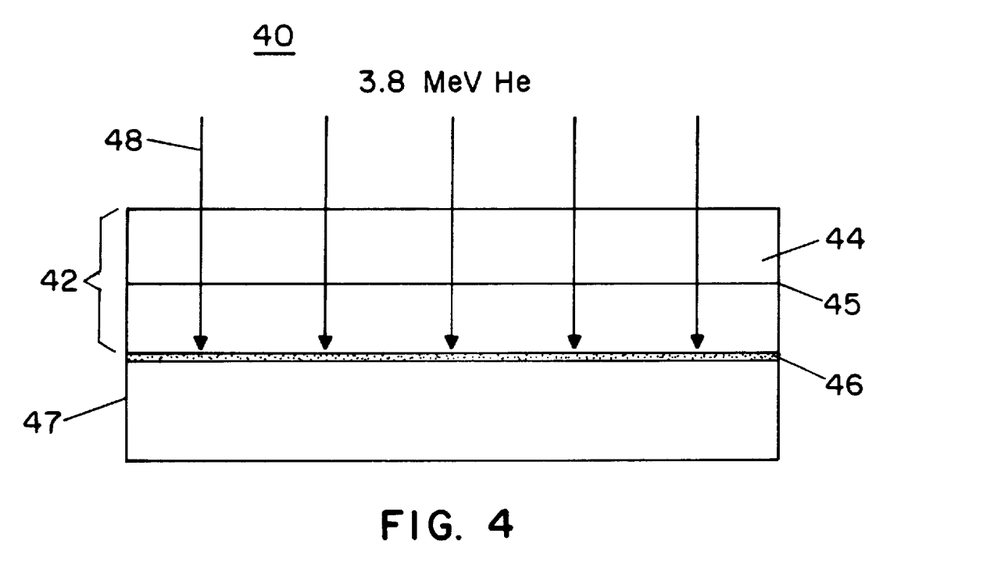
FIG. 4 shows an ion implantation step according to the crystal ion-slicing method of FIG. 2 whereby an epilayer/substrate crystal structure is used for forming a YIG or Bi—YIG single-crystal metal oxide film.

FIG. 4 shows a preferred method of FIG. 2 wherein singly-charged 3.8 MeV helium ions 48, for example, are implanted normal to the top surface of an epilayer/substrate crystal structure 40 to form a damage layer 46 within the crystal structure 40. The crystal structure 40 includes a YIG, Bi—YIG or other garnet epilayer 42, a GGG or other growth-compatible substrate 47, and an epilayer/substrate interface 45. During implantation, the implantation dose for the singly-charged 3.8 MeV helium ions is nominally on the order of $5 \times 10^{16}$ ions/cm$^2$. The samples are mounted on a specially designed, two-inch diameter water-cooled target holder to ensure that the temperature of the substrate is below 400° C.

As an added precaution, the current beam during ion implantation is kept low, e.g., less than 0.25 $\mu$A/cm$^2$. This precaution is necessary to avoid modifying the optical absorptivity and magnetic anisotropy of the sample during ion implantation. The uniformity of the implantation is checked by four Faraday cups outside the target holder.

Figure 5:
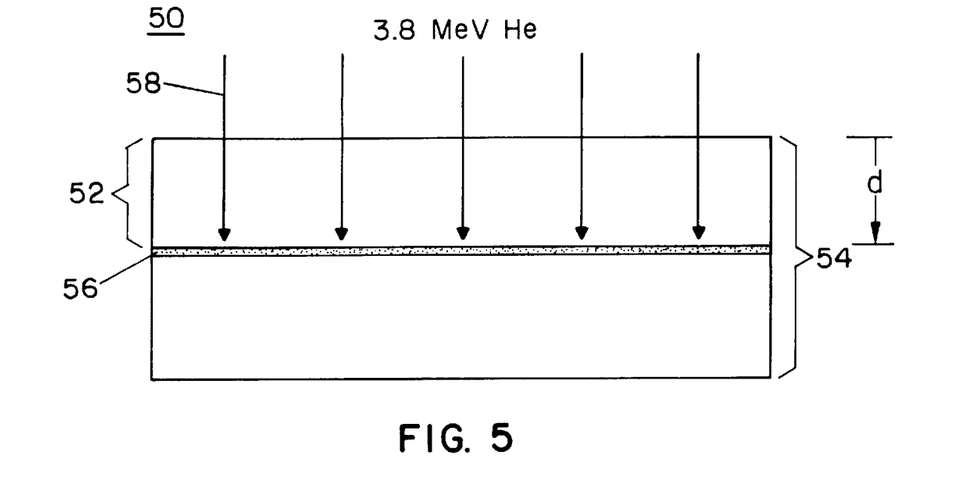
FIG. 5 shows an ion implantation step according to the crystal ion-slicing method of FIG. 2 whereby a bulk crystal structure is used for forming a $LiNbO_3$ single-crystal metal oxide film.

Similarly, as shown in FIG. 5, singly-charged 3.8 MeV helium ions 58 can be implanted normal to the surface of a bulk crystal structure 50 to form a damage layer 56 within the crystal structure 40. The bulk crystal structure 50 may be comprised of a magnetic garnet or ferromagnetic material.

In the preferred method as shown in FIGS. 2 through 5, a light weight implantation species, preferably helium, is advantageously chosen to yield a deeply buried damage layer. In addition, helium is desirable because of the resulting implantation profile and the distribution of lattice damage in the crystal, which in turn is determined by the energy loss per unit trajectory length, or "stopping power." At high ionic energies, the "stopping power" is dominated by electronic scattering and is characterized by the Lindhard-Scharff-Schiott ("LSS") theory. The LSS theory predicts a stopping power proportional to $\sqrt{E}$, where E is the energy of the implanted ion along its trajectory for high ionic energies. At low energies, the "stopping power" is inversely proportional to $E^2$ and is primarily characterized by Rutherford scattering with the host nuclei.

Figure 6:
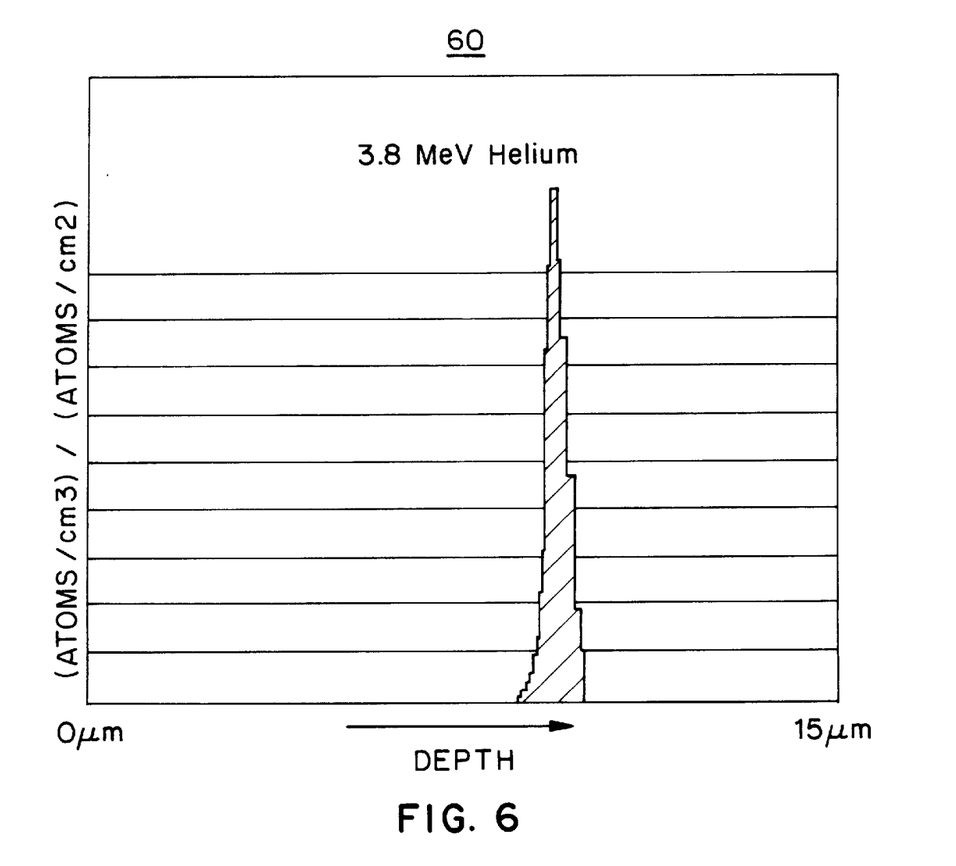
FIG. 6 shows an implantation distribution for 3.8 MeV helium ions in yttrium iron garnet.

FIG. 6 shows an implantation distribution profile for helium ions implanted at 3.8 MeV of energy into a YIG/GGG crystal structure. The implantation distribution profile of FIG. 6 is based on simulation results from transport-of-ions-in-matter ("TRIM") calculations, which match actual implantation distribution values for helium ions implanted at 3.8 MeV of energy into a YIG/GGG crystal structure. Advantageously, the implantation profile is narrow and concentrated at approximately 9 $\mu$m below the surface of the crystal structure. The implantation distribution profile for helium ions implanted at 3.8 MeV of energy into a Bi—YIG/GGG crystal structure exhibits an almost identical implantation depth.

Referring again to the preferred method 20 of FIG. 2, the ion implantation step 22 is followed by a chemical etching step for dissolving the damage, or "sacrificial," layer from the crystal structure substrate. Once the damage layer is dissolved by the chemical etching step, the single-crystal film detaches from the substrate and becomes available for transfer and bonding onto a growth-incompatible substrate.

Figure 7A:
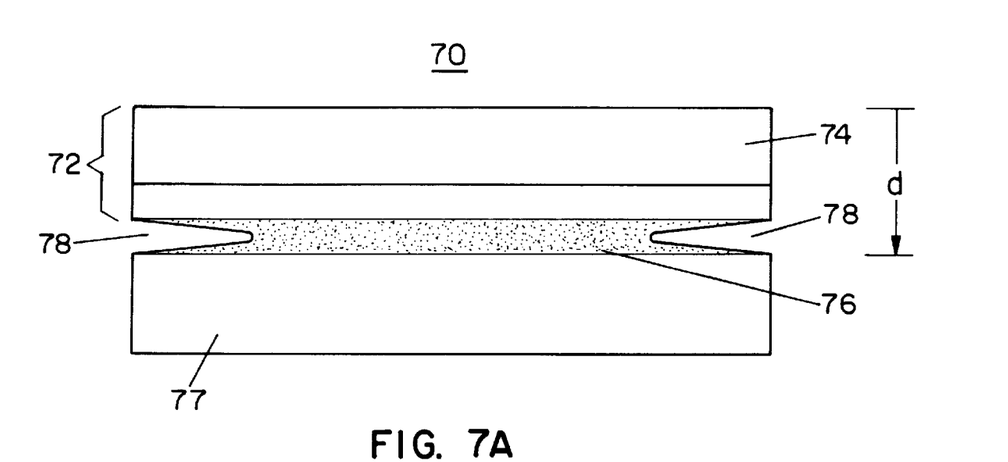
FIGS. 7A and 7B are side and top views, respectively, showing an etching step according to the crystal ion-slicing method of FIG. 2.
Figure 7B:
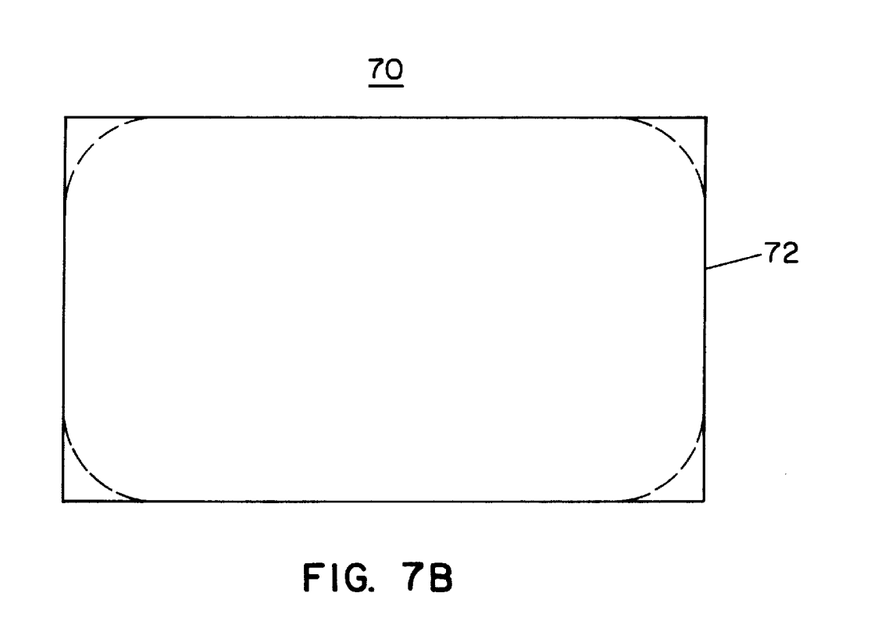

FIGS. 7A and 7B are side and top views, respectively, showing an etching step according to the crystal ion-slicing method of FIG. 2. As shown in FIG. 7A, a chemical etchant is applied to an epilayer/substrate crystal structure 70 having a substrate 77, an epilayer 74 disposed on a top surface of the substrate 74, and a damage layer 76. After the appropriate exposure period, the chemical etchant causes the single-crystal film 72 to become detached from the substrate 74. The effect of the chemical etchant is the same whether the damage layer 76 is disposed within the substrate 77 or within the epilayer 74 itself. The etch rate, however, may be vary depending upon whether the damage layer 76 is disposed within the substrate 77 or within the epilayer 74.

Preferably, a commercial 85%-dilution orthophosphoric acid is used for detaching YIG/Bi—YIG single-crystal films from YIG/GGG or Bi—YIG/GGG crystal structures. Furthermore, to speed up the chemical etching process, the orthophosphoric acid is advantageously stirred and maintained at a constant temperature, preferably 70° C. The temperature of the acid can be further increased to achieve faster etching rates.

Nominally, the etchant is applied to the crystal structure 70 for 24 to 48 hours depending upon the size of the single-crystal film to be detached. As further shown in FIG. 7A, a deep undercut 78 forms in the substrate 77 after several hours of exposure to the chemical etchant. With reference to the implantation steps as shown in FIG. 4, for example, the undercut (not shown) is centered at approximately 9 $\mu$m below the top surface of the YIG/GGG crystal structure 40 in accordance with the implantation distribution profile of FIG. 6. After etching, the substrate 47 is detached leaving the single-crystal film with an underside that is microscopically smooth and suitable for bonding unto a growth-incompatible substrate.

The differential etch rate between sacrificial layer and the rest of the crystal structure is determined by comparing the etch rate of the undercut 78 to that of the top surface of the under the same conditions. The latter is determined by masking a section of the top surface with silicon dioxide and measuring the etch step with a profilometer. The degree of undercut is measured using Nomarski prism microscopy, or by cleaving off a section of the single-crystal film overhang. The etch selectivity, defined as the ratio of etch rates between sacrificial layer and the top surface, is found to be in excess of $10^3$.

For detaching LiNbO$_3$ single-crystal films from bulk crystal structures such as the one shown in FIG. 5, 5% diluted hydrofluoric acid is preferred for chemically etching the "sacrificial" layer from the LiNbO$_3$ bulk crystal structure. The etching is performed at room temperature for 24 hours or less for detaching a 1 mm$^2$ sample of the LiNbO$_3$ single-crystal film.

As illustrative examples of the present invention, the crystal ion-slicing method of FIG. 2 has been used to detach magnetic garnet material layers from a GGG substrate. In one example, 10 $\mu$m and 95 $\mu$m-thick YIG epilayers were grown by liquid phase epitaxy on a GGG substrate containing small amounts of lanthanum to improve lattice matching to the GGG substrate. In another example, 3 $\mu$m-thick Bi—YIG thin-films also grown on a GGG substrate. In both cases, the method of FIG. 2 was used to detach high quality single-crystal films approximately 9 to 10 $\mu$m-thick from the original substrates. The single-crystal films were then van der Waals bonded to growth-incompatible substrates such as silicon and gallium arsenide substrates. Faraday contrast examination of the magnetic domains of the single-crystal films indicated no change in the domain structure and coercivity of the garnet materials as a result of the crystal ion-slicing process.

Referring again to the preferred method of FIG. 2, the chemical etching step may however result in residual lattice damage, surface roughening or corner fracturing of the top surface of the single-crystal film. For example, using a surface profilometer, six hours of exposure under typical etching conditions has been shown to yield an average roughness of 20 nm in the YIG/GGG example of FIG. 4. In addition, corner fracturing may occur during the chemical etching step as shown by the broken lines of FIG. 7B. Consequently, additional protective measures are required to minimize damage to the single-crystal film and to ensure the production of high quality thin-films.

Figure 8:
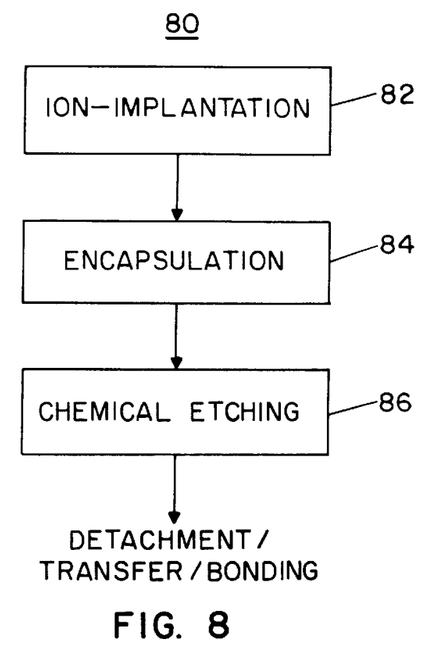
FIG. 8 shows a preferred method for crystal ion-slicing whereby damage to the single-crystal metal oxide film is minimized by encapsulation.

FIG. 8 therefore shows a preferred method 80 for crystal ion-slicing a single-crystal film from a crystal structure whereby residual lattice damage and surface roughening is minimized by encapsulation. The method 80 includes the steps of implanting ions into a crystal structure to form a damage layer within the substrate (Step 82), encapsulating the top surface of the single-crystal film (Step 84), and chemically etching the damage layer from the substrate (Step 86). According to a preferred aspect of the present invention, the corners of the single-crystal film 72 of FIG. 7 are encapsulated with molten wax or an Apiezon W mixture to prevent fracturing of the single-crystal film due to the residual lattice damage and surface roughening caused by the subsequent chemical etching step.

Figure 9:
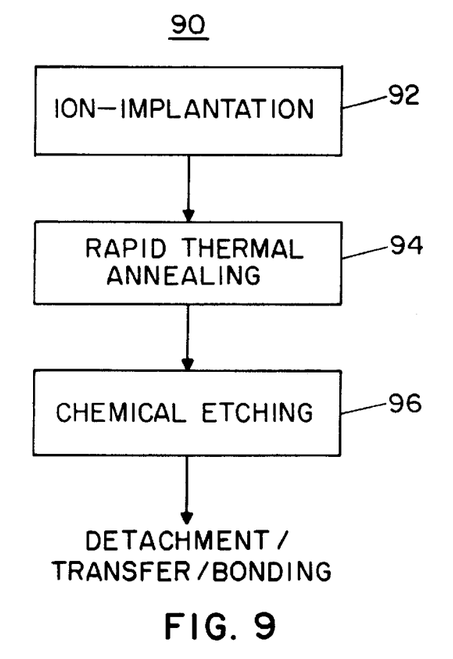
FIG. 9 shows a preferred method for crystal ion-slicing whereby residual lattice damage and surface roughening is minimized by rapid thermal annealing.

FIG. 9 shows a preferred method for crystal ion-slicing a single-crystal film from a crystal structure whereby residual lattice damage and surface roughening is minimized by rapid thermal annealing. The method 90 includes the steps of implanting ions into a crystal structure to form a damage layer within the substrate (Step 92), rapid thermal annealing (Step 94) and chemical etching of the damage layer from the substrate (Step 96).

As shown in FIG. 9, the rapid thermal annealing step (Step 94) is performed after the ion implantation step (Step 90) but before chemical etching step (Step 96). The rapid thermal annealing serves to repair the residual damage without compromising the efficiency of the subsequent wet etching of the buried layer. Preferably, a 40 second anneal at 700° C. in forming gas comprised of 5% hydrogen and 95% nitrogen results in a smooth surface and thus high-quality single-crystal films. By contrast, a rapid temperature annealing step performed at temperatures above 800° C. is undesirable since it significantly impairs the etch rate of the buried layer by annealing out the damage in the "sacrificial" layer. Consequently, the method of FIG. 9 including the rapid temperature annealing step (Step 94) performed at approximately 800° C. will reduce the etch rate associated with the subsequent chemical etching step (Step 96) as compared to a method not including the rapid temperature annealing step (Step 94).

Referring again to the preferred method of FIG. 2, the duration of the chemical etching step 24 is nominally 24 to 48 hours depending upon the size of single-crystal film to be detached. For example, to fully detach a square-millimeter area section of film from a substrate, the crystal structure must be exposed to the etchant for approximately 24 to 48 hours.

Figure 10:
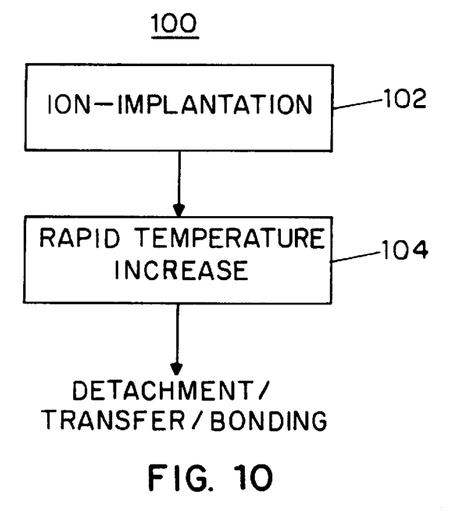
FIG. 10 shows a preferred method for crystal ion-slicing whereby the crystal structure is exposed to a rapid temperature increase.

Therefore, as a faster alternative to the method of FIG. 2, FIG. 10 shows another preferred method 100 for crystal ion-slicing a single-crystal film, from either an epilayer/substrate or bulk crystal structure, whereby the crystal structure is exposed to a rapid temperature increase to effect detachment of the single-crystal film from the growth-compatible substrate. The method 100 includes the steps of implanting ions into a crystal structure below the epilayer/substrate interface to form a damage layer within the growth-compatible substrate (Step 100), and exposing the crystal structure to a rapid temperature increase so as to effect the detachment or "snap-off" of the single-crystal film from the growth-compatible substrate (Step 102). The exposure step 102 of FIG. 10 includes raising the temperature of the crystal structure from room temperature to approximately 750 to 800° C. within 60 seconds. Detachment of the single-crystal film is thereby achieved by maintaining the temperature of the crystal structure at approximately 750 to 800° C. for approximately 30 seconds.

As an additional step, the damage layer may be chemically treated during or before ion implantation with a chemically enhancing gas, such as chlorine gas, or liquid to enhance detachment of the single-crystal film. Chemical treatment of the damage layer may also be performed so as to minimize the degree of the rapid temperature increase required to effect detachment of the single-crystal film from the crystal structure.

Figure 11:
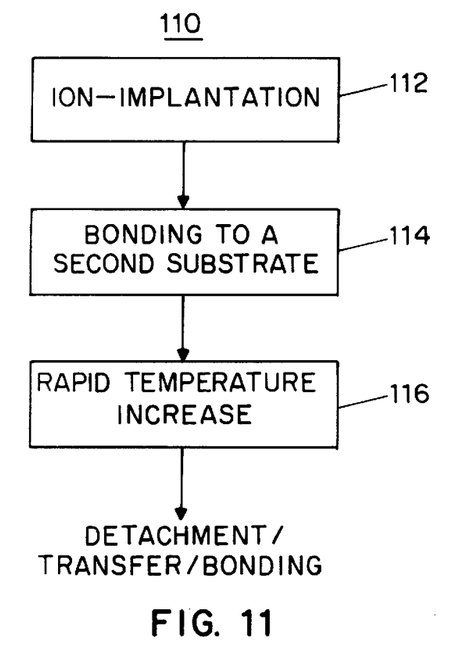
FIG. 11 shows a preferred method for crystal ion-slicing whereby the crystal structure is bonded to a second substrate and is exposed to a rapid temperature increase.

FIG. 11 shows a preferred method 110 for crystal ion-slicing a single-crystal film from a crystal structure whereby the crystal structure is bonded, directly or indirectly, to a second substrate and exposed to a rapid temperature increase to detach the single-crystal film from the growth-compatible substrate. The method can be used with the epilayer/substrate crystal structure of FIG. 1A and as further shown in FIGS. 12 and 13, or the bulk crystal structure of FIG. 1B.

Referring again to FIG. 11, the method 110 includes the steps of implanting ions into a crystal structure to form a damage layer within the crystal structure (Step 112), bonding the top surface of the single-crystal film, either directly or indirectly, to a second substrate (Step 114), and exposing the crystal structure to a rapid temperature increase so as to effect the detachment or "snap-off" of a single-crystal film from the crystal structure (Step 116). As with the method of FIG. 10, the exposure step (Step 116) includes raising the temperature of the crystal structure from room temperature to approximately 750 to 800° C. within 60 seconds. Detachment of the single-crystal film is thereby achieved by maintaining the temperature of the crystal structure at approximately 750 to 800° C. for at approximately 30 seconds.

The second substrate according to the bonding step (Step 114) is advantageously bonded directly onto the top surface of the crystal structure, preferably by the technique of direct wafer bonding as described by Yokoi et al. in *"Improved heat treatment for wafer direct bonding between semiconductors and magnetic garnets,"* Japan Journal of Applied Physics, vol 36, p. 2784 (1997). The second substrate can be a semiconductor such as silicon or GaAs. This method is advantageous in that the single-crystal film layer remains bonded to the second substrate after the single-crystal film is detached from the crystal structure.

Alternatively, the method of FIG. 11 may include the step of applying a low-temperature bonding layer between the top surface of the crystal structure and the second substrate. The function of the low-temperature bonding layer is to avoid annealing out the damage or sacrificial layer during the detachment process. This technique is the same regardless of whether an epilayer/substrate or bulk crystal structure is used.

Figure 12:
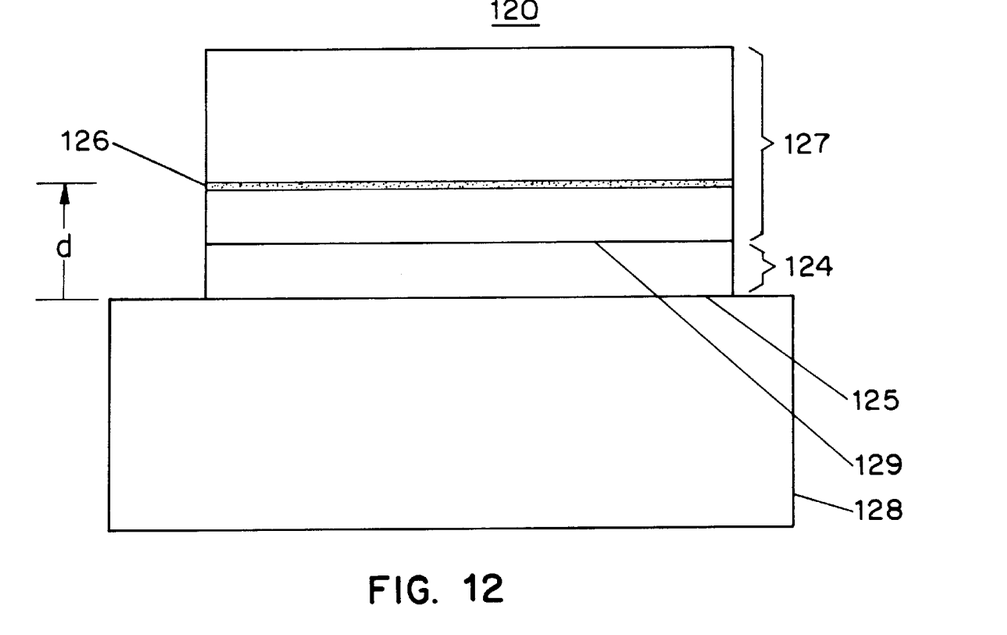
FIG. 12 shows a modified crystal structure for use with the method of FIG. 11 wherein a second substrate is bonded directly onto the top surface of a single-crystal film.

FIG. 12 shows a modified crystal structure 120 for use in the preferred method of FIG. 11. By way of example and not limitation, the modified crystal structure 120 is similar to the epilayer/substrate crystal structure shown in FIG. 1A. The modified crystal structure 120 includes a first, growth-compatible substrate 127, the second substrate 128, an epilayer 124 disposed between the first and second substrates 127 and 128, and a damage layer 126 disposed in the first substrate 127 a depth d from the interface 125 between the epilayer 124 and the second substrate 128. The first and second substrates 127 and 128 are preferably bonded together by direct wafer bonding. The epilayer 124 is preferably a layer of magnetic garnet or ferroelectric material mounted between the first substrate 127 such as GGG or other growth-compatible substrate.

Figure 13:
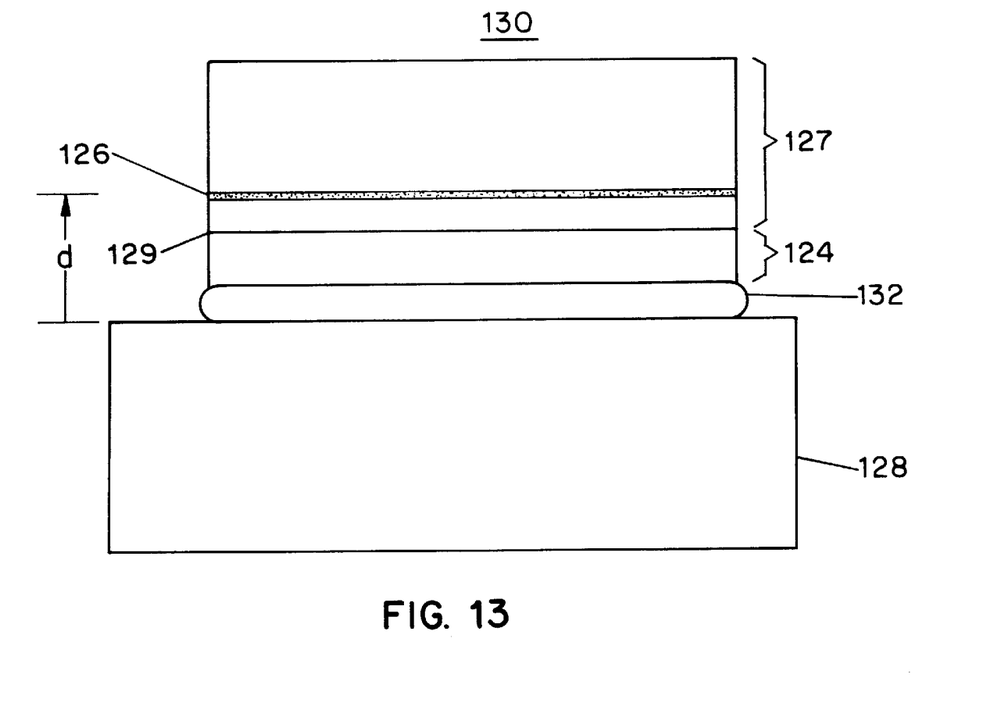
FIG. 13 shows a modified crystal structure for use with the method of FIG. 11 wherein a second substrate is bonded indirectly onto the top surface of a single-crystal film.

FIG. 13 shows another modified crystal structure 130 for use in the preferred method of FIG. 11 wherein the second substrate 128 is indirectly bonded to the single-crystal film 124. As shown in FIG. 13, the modified crystal structure 130, by way of example and not limitation, includes a first, growth-compatible substrate 127, a second substrate 128, an epilayer 124 disposed between on the first substrate 127, a bonding layer 132 disposed between the epilayer 124 and the second substrate 128, and a damage layer 126 disposed in the first substrate 127 a depth d from the interface 125 between the epilayer 124 and the second substrate 128.

As shown in FIG. 13, the epilayer 124 is preferably a layer of magnetic garnet or ferroelectric material mounted between the first substrate 127, which is preferably a GGG or other growth-compatible substrate. The bonding layer 132 is preferably a low temperature melting material, such as low temperature melting glass, which has a melting point less than the 750 to 800° C. temperature plateau of Steps 104 and 116 of FIGS. 10 and 11, respectively.

Although the present invention has been described in connection with particular embodiments thereof, it is to be understood that such embodiments are susceptible of modification and variation without departing from the inventive concept disclosed. All such modifications and variations, therefore, are intended to be included within the spirit and scope of the appended claims.

What is claimed is:

1. A method for detaching a single-crystal metal oxide film from a metal oxide crystal structure, said method comprising the steps of:

implanting ions into said crystal structure to form a damage layer within said crystal structure at an implantation depth below a top surface of said crystal structure, said top surface and said damage layer defining at least in part said single-crystal metal oxide film to be detached from said crystal structure; and chemically etching said damage layer to effect detachment of said single-crystal film metal oxide from said crystal structure.

2. The method according to claim 1, wherein said crystal structure is an epilayer/substrate crystal structure having a metal oxide epilayer disposed on a growth-compatible substrate.

3. The method according to claim 2, wherein said ion implanting step comprises the step of implanting ions into said growth-compatible substrate to form a damage layer within said growth-compatible substrate at said implantation depth below said top surface of said epilayer/substrate crystal structure.

4. The method according to claim 2, wherein said ion implanting step comprises the step of implanting ions into said metal oxide epilayer to form a damage layer within said metal oxide epilayer at said implantation depth below said top surface of said epilayer/substrate crystal structure.

5. The method according to claim 2, wherein said metal oxide epilayer is a layer of magnetic garnet material.

6. The method according to claim 2, wherein said metal oxide epilayer is a layer of ferroelectric material.

7. The method according to claim 2, wherein said crystal structure is an epilayer/substrate crystal structure has a plurality of metal oxide epilayers disposed within said growth-compatible substrate.

8. The method according to claim 1, wherein said crystal structure is a bulk crystal structure including a metal oxide material.

9. The method according to claim 8, wherein said ion implanting step comprises the step of implanting ions into said bulk crystal structure to form a damage layer within said bulk crystal structure at said implantation depth below said top surface of said bulk crystal structure.

10. The method according to claim 8, wherein said metal oxide material is a magnetic garnet material.

11. The method according to claim 8, wherein said metal oxide material is a ferroelectric material.

12. The method according to claim 11, wherein said ferroelectric material is lithium niobate.

13. The method according to claim 12, wherein said etching step comprises the step of applying diluted hydrofluoric acid at room temperature.

14. The method according to claim 1, wherein said implanting step comprises the step of providing ions at a characteristic energy level which determines said implantation depth.

15. The method according to claim 1, wherein said ions are elemental ions.

16. The method according to claim 1, wherein said ions are chemically reactive ions.

17. The method according to claim 1, wherein said chemical etching step comprises the steps of:

immersing said damage layer in an etchant;

stirring said etchant; and maintaining said etchant at a constant etching temperature.

18. The method according to claim 17, wherein said etching temperature is increased higher than room temperature to achieve a faster etching rate.

19. The method according to claim 1, further comprising the step of encapsulating said crystal structure prior to said chemical etching step to minimize damage to the single-crystal film in said chemical etching step.

20. The method according to claim 1, further comprising the step of rapid thermal annealing prior to said chemical etching step to minimize damage to the single-crystal film in said chemical etching step.

21. A method for detaching a single-crystal metal oxide film from a metal oxide crystal structure, comprising the steps of:

implanting ions into said crystal structure to form a damage layer within said crystal stricture at an implantation depth below a top surface of said crystal structure, said top surface and said damage layer defining at least in part said single-crystal metal oxide film to be detached from said crystal structure; and exposing said damage layer to a rapid temperature increase to effect detachment of said single-crystal metal oxide film from said crystal structure.

22. The method according to claim 21, wherein said crystal structure is an epilayer/substrate crystal structure having a metal oxide epilayer disposed on a growth-compatible substrate.

23. The method according to claim 22, wherein said metal oxide epilayer is a layer of magnetic garnet material.

24. The method according to claim 22, wherein said metal oxide epilayer is a layer of ferroelectric material.

25. The method according to claim 21, wherein said metal oxide crystal structure is a bulk crystal structure including a metal oxide material.

26. The method according to claim 21, wherein said exposing step comprises the steps of:

increasing the temperature of said crystal structure from room temperature to a temperature within a first temperature range; and maintaining said temperature of said crystal structure within said first temperature range to effect detachment of said single-crystal metal oxide film from said crystal structure.

27. The method according to claim 26, wherein said temperature increasing step is performed for less than 60 second.

28. The method according to claim 26, wherein said temperature maintaining step is performed for approximately 30 seconds.

29. The method according to claim 26, wherein said first temperature range is approximately 750 to 800° C.

30. The method according to claim 21, further comprising the step of chemically treating said damage layer to enhance detachment of said single-crystal metal oxide film from said crystal structure.

31. The method according to claim 21, wherein said temperature exposing step comprises the step of low-temperature melting said damage layer to effect detachment of said single-crystal metal oxide film from said crystal structure.

32. The method according to claim 30, wherein said step of chemically treating said damage layer minimizes the magnitude of said rapid temperature increase required to effect detachment of said single-crystal metal oxide film from said crystal structure.

33. The method according to claim 32, wherein said temperature exposing step comprises the step of low-temperature melting said damage layer to effect detachment of said single-crystal metal oxide film from said crystal structure.

34. A method for detaching a single-crystal metal oxide film from a metal oxide crystal structure, said method comprising the steps of:

implanting ions into said crystal structure to form a damage layer within said crystal structure at an implantation depth below a top surface of said crystal structure, said top surface and said damage layer defining at least in part said single-crystal metal oxide film to be detached from said crystal structure;

bonding said crystal structure to a second substrate; and exposing said damage layer to a rapid temperature increase to effect detachment of said single-crystal metal oxide film from said crystal structure.

35. The method according to claim 34, wherein said crystal structure includes a magnetic garnet material.

36. The method according to claim 34, wherein said crystal structure includes a ferroelectric material.

37. The method according to claim 34, wherein said second substrate is a low temperature melting material.

38. The method according to claim 34, wherein said exposing step comprises the steps of:

increasing the temperature of said crystal structure from room temperature to a temperature within a first temperature range; and maintaining said temperature of said crystal structure within said first temperature range to effect detachment of said single-crystal metal oxide film from said crystal structure.

39. The method according to claim 38, wherein said temperature increasing step is performed for less than 60 second.

40. The method according to claim 38, wherein said temperature maintaining step is performed for approximately 30 seconds.

41. The method according to claim 38, wherein said first temperature range is approximately 750 to 800° C.

42. The method according to claim 34, further comprising:

applying a bonding layer between said crystal structure and said second substrate; and melting away said bonding layer to effect detachment of said single-crystal metal oxide film from said crystal structure.

43. The method according to claim 42, wherein said bonding layer is a low-temperature melting material.

* * * * *